(12) United States Patent
Choi

(10) Patent No.: US 11,264,064 B2
(45) Date of Patent: Mar. 1, 2022

(54) DATA DRIVING CIRCUIT

(71) Applicant: SK hynix Inc., Icheon-si (KR)

(72) Inventor: Eun Ji Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 2 days.

(21) Appl. No.: 16/902,876

(22) Filed: Jun. 16, 2020

(65) Prior Publication Data
US 2021/0201962 A1 Jul. 1, 2021

(30) Foreign Application Priority Data
Dec. 26, 2019 (KR) .................. 10-2019-0175034

(51) Int. Cl.
*G11C 7/10* (2006.01)
*G11C 7/22* (2006.01)

(52) U.S. Cl.
CPC ............ *G11C 7/106* (2013.01); *G11C 7/1057* (2013.01); *G11C 7/1066* (2013.01); *G11C 7/222* (2013.01)

(58) Field of Classification Search
CPC ...................................... G11C 7/106
USPC .................................... 365/189.05
See application file for complete search history.

(56) References Cited

U.S. PATENT DOCUMENTS

| | | | |
|---|---|---|---|
| 7,068,078 B2 | 6/2006 | Yoo | |
| 7,760,561 B2 * | 7/2010 | Lee | H03K 19/094 365/189.15 |
| 7,906,986 B2 * | 3/2011 | Lee | H03K 19/0005 326/30 |
| 8,441,870 B2 | 5/2013 | Kim | |
| 8,907,698 B2 | 12/2014 | Jung | |
| 10,504,571 B1 * | 12/2019 | Johnson | G11C 7/109 |
| 2011/0249520 A1 * | 10/2011 | Kim | G11C 7/222 365/193 |
| 2012/0134439 A1 * | 5/2012 | Sato | G11C 29/025 375/295 |
| 2015/0063041 A1 * | 3/2015 | Arai | G11C 7/1051 365/189.05 |
| 2018/0033470 A1 * | 2/2018 | Lee | G11C 29/50008 |
| 2018/0053567 A1 * | 2/2018 | Kim | G11C 29/022 |
| 2018/0075885 A1 * | 3/2018 | Jung | G11C 29/50008 |

FOREIGN PATENT DOCUMENTS

KR 100502664 B1 7/2005

* cited by examiner

*Primary Examiner* — Muna A Techane
(74) *Attorney, Agent, or Firm* — William Park & Associates Ltd.

(57) ABSTRACT

A data driving circuit may include a trigger circuit and a pre-driver. The trigger circuit may be configured to block a remaining signal path among a plurality of signal paths for transmitting data except for a signal path corresponding to a currently selected driving strength. The pre-driver may be configured to drive data, which are transmitted through the signal path corresponding to the currently selected driving strength, using an impedance determined in accordance with a plurality of impedance control codes.

12 Claims, 11 Drawing Sheets

DATA DRIVING CIRCUIT

CROSS-REFERENCES TO RELATED APPLICATION

The present application claims priority under 35 U.S.C. § 119(a) to Korean application number 10-2019-0175034, filed on Dec. 6, 2019, in the Korean Intellectual Property Office, which is incorporated herein by reference in its entirety.

BACKGROUND

1. Technical Field

Various embodiments may generally relate to a semiconductor circuit, and more particularly, to a data driving circuit.

2. Related Art

A semiconductor circuit may include a data driving circuit configured to output data to an external device.

The data driving circuit may be designed for embodying various impedances corresponding to specifications for driving strength and termination of a semiconductor device.

SUMMARY

In accordance with an embodiment of the present disclosure, a data driving circuit may include a trigger circuit and a pre-driver. The trigger circuit may be configured to block a remaining signal path among a plurality of signal paths for transmitting data except for a signal path corresponding to a currently selected driving strength. The pre-driver may be configured to drive data, which are transmitted through the signal path corresponding to the currently selected driving strength using an impedance determined in accordance with a plurality of impedance control codes.

BRIEF DESCRIPTION OF THE DRAWINGS

The above and other aspects, features, and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined by the appended claims.

The present teachings are described herein in part with reference to cross-section and/or plan illustrations of idealized embodiments of the present teachings. However, embodiments of the present teachings should not be construed as being limiting. Although a few embodiments of the present teachings are shown and described, it will be appreciated by those of ordinary skill in the art that changes may be made in these embodiments without departing from the principles and spirit of the present teachings.

Some embodiments are directed to data driving circuits capable of simplifying logic and reduced power consumption.

Figure 1:
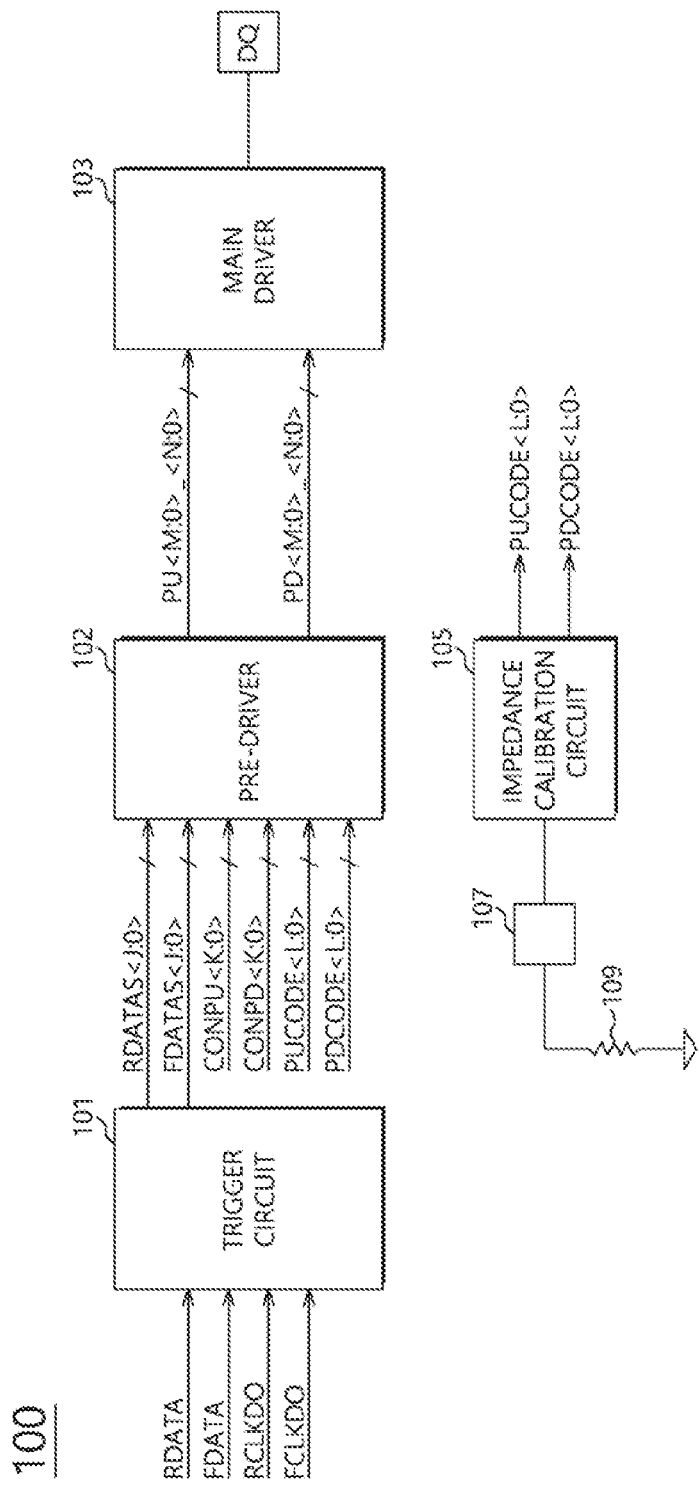
FIG. 1 illustrates a data driving circuit in accordance with example embodiments.

FIG. 1 is a view illustrating a data driving circuit 100 in accordance with example embodiments.

Referring to FIG. 1, the data driving circuit 100 may include a trigger circuit 101, a pre-driver 102, and a main driver 103.

Further, the data driving circuit 100 of this example embodiment may further include an impedance calibration circuit 105.

The trigger circuit 101 may latch a plurality of first data RDATA and FDATA in accordance with a plurality of clock signals RCLKDO and FCLKDO having phase difference to output a plurality of second data RDATAS<J:0> and FDATAS<J:0>.

The pre-driver 102 may drive the second data RDATAS<J:0> using a driving strength determined in accordance with a plurality of driving strength control signals CONPU<K:0> and CONPD<K:0> and an impedance determined in accordance with a plurality of impedance control codes PUCODE<L:0> and PDCODE<L:0> to output a plurality of driving control signals PU<M:0>_<N:0> and PD<M:0>_<N:0>.

The main driver 103 may drive an output terminal DQ in accordance with the driving control signals PU<M:0>_<N:0> and PD<M:0>_<N:0>.

The impedance calibration circuit 105 may control the impedance control codes PUCODE<L:0> and PDCODE<L:0> to have a resistance of an external resistor 109 connected to an external resistor pad 107 as a target value.

Figure 2:
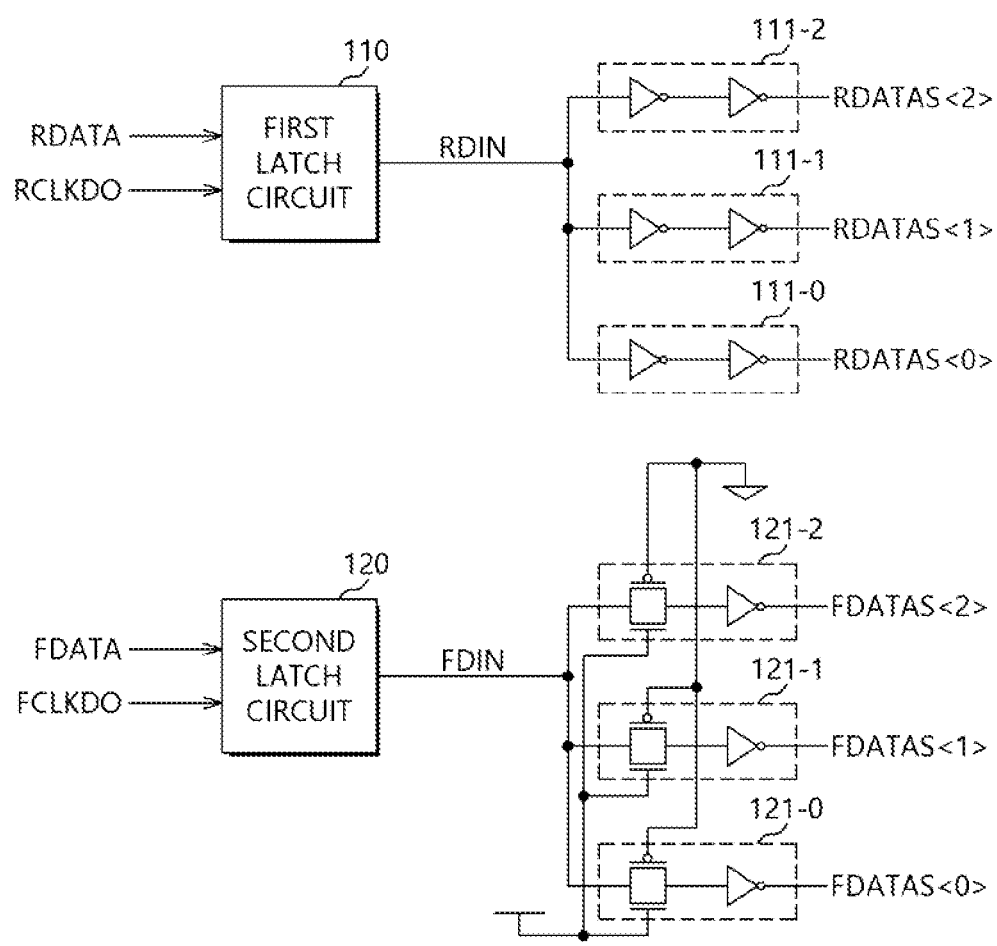
FIG. 2 illustrates a trigger circuit of FIG. 1.

FIG. 2 is a view illustrating the trigger circuit 101 in FIG. 1. FIG. 2 shows the trigger circuit 101 when J in the second data RDATAS<J:0> and FDATAS<J:0> is 2.

Referring to FIG. 2, the trigger circuit 101 may include a first latch circuit 110, first signal distribution circuits 111-0~111-2, a second latch circuit 120, and second signal distribution circuits 121-0~121-2. As used herein, the tilde "~" indicates a range of components. For example, "111-0~111-2" indicates the first signal distribution circuits 111-0, 111-1, and 111-2 shown in FIG. 2.

The first latch circuit 110 may latch first data RDATA in accordance with a first clock signal RCLKDO among the clock signals RCLKDO and FCLKDO to generate a first latch signal RDIN.

The first signal distribution circuits 111-0~111-2 may distribute the first latch signal RDIN to output second data RDATAS<2:0> among the second data RDATAS<2:0> and FDATAS<2:0>.

In example embodiments, each of the first signal distribution circuits 111-0~111-2 may include an inverter chain.

The second latch circuit 120 may latch first data FDATA in accordance with a second clock signal FCLKDO among the clock signals RCLKDO and FCLKDO to generate a second latch signal FDIN.

The second signal distribution circuits 121-0~121-2 may distribute the second latch signal FDIN to output second data FDATAS<2:0> among the second data RDATAS<2:0> and FDATAS<2:0>.

In example embodiments, each of the second signal distribution circuits 121-0~121-2 may include a transmission gate and an inverter.

The transmission gate may include a negative control terminal configured to receive a ground voltage and a positive control terminal configured to receive a power voltage.

The transmission gate may configured to provide the second signal distribution circuits 121-0~121-2 and the first signal distribution circuits 111-0~111-2 with a same signal delay time.

Figure 3:
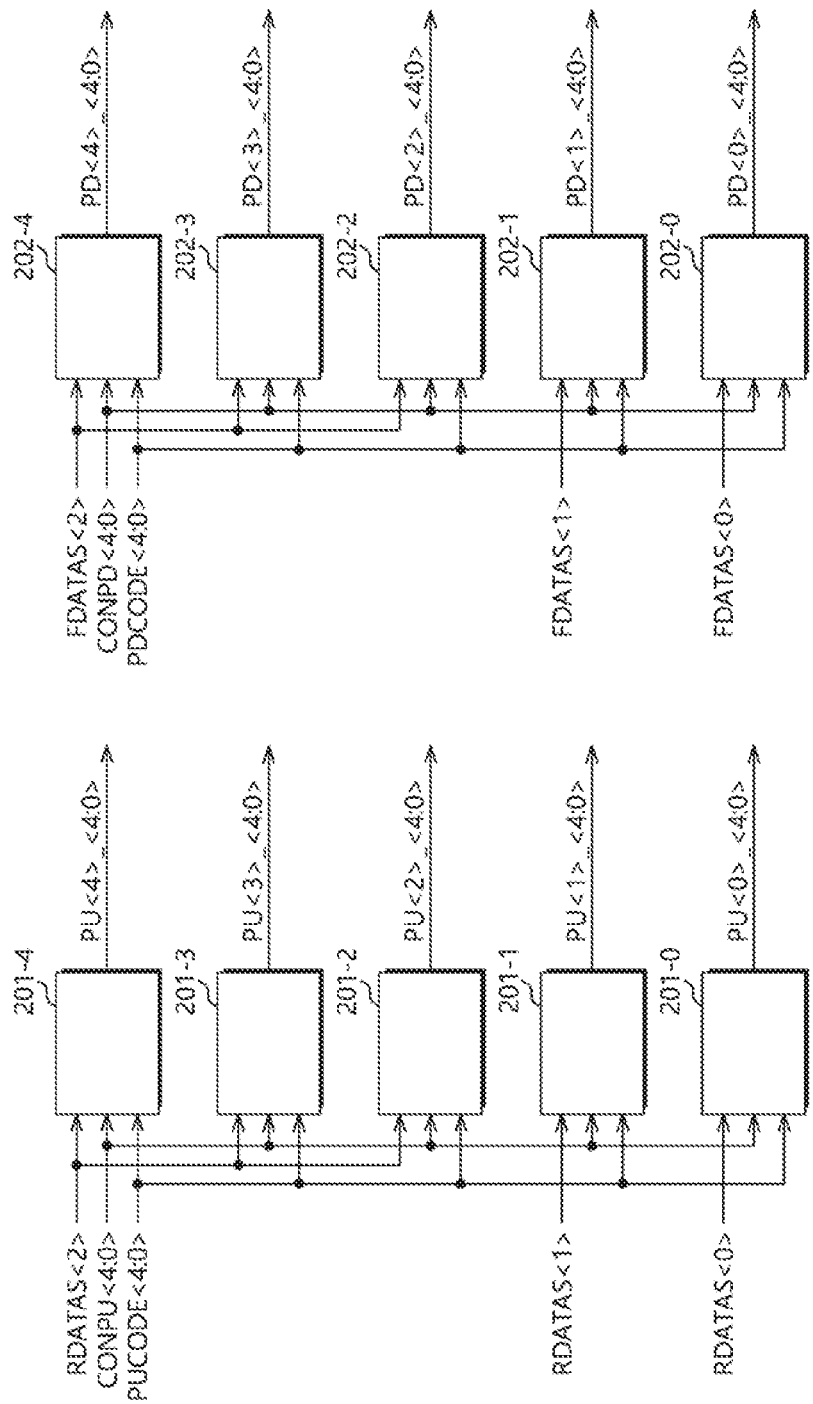
FIG. 3 illustrates a pre-driver of FIG. 1.

FIG. 3 is a view illustrating the pre-driver 102 in FIG. 1.

FIG. 3 shows the pre-driver 102 when K, L, M, and N in the driving strength control signals CONPU<K:0> and CONPD<K:0>, the impedance control codes PUCODE<L:0> and PDCODE<L:0> and the driving control signals PU<M:0>_<N:0> and PD<M:0>_<N:0> are 4.

Referring to FIG. 3, the pre-driver 102 may include a plurality of pre driving units 201-0~201-4 and 202-0~202-4.

The pre driving units 201-0~201-4 and 202-0~202-4 may be classified into a plurality of pre pull-up driving units 201-0~202-4 and a plurality of pre pull-down driving units 202-0~202-4.

The first pre pull-up driving unit 201-0 may generate first driving control signals PU<0>_<4:0> in accordance with the second data RDATAS<0>, the first driving strength control signals CONPU<4:0> and the first impedance control code PUCODE<4:0>.

The second pre pull-up driving unit 201-1 may generate first driving control signals PU<1>_<4:0> in accordance with the second data RDATAS<1>, the first driving strength control signals CONPU<4:0> and the first impedance control code PUCODE<4:0>.

The third pre pull-up driving unit 201-2 may generate first driving control signals PU<2>_<4:0> in accordance with the second data RDATAS<2>, the first driving strength control signals CONPU<4:0>, and the first impedance control code PUCODE<4:0>.

The fourth pre pull-up driving unit 201-3 may generate first driving control signals PU<3>_<4:0> in accordance with the second data RDATAS<2>, the first driving strength control signals CONPU<4:0>, and the first impedance control code PUCODE<4:0>.

The fifth pre pull-up driving unit 201-4 may generate first driving control signals PU<4>_<4:0> in accordance with the second data RDATAS<2>, the first driving strength control signals CONPU<4:0>, and the first impedance control code PUCODE<4:0>.

The first pre pull-down driving unit 202-0 may generate second driving control signals PD<0>_<4:0> in accordance with the second data FDATAS<0>, the second driving strength control signals CONPD<4:0>, and the second impedance control code PDCODE<4:0>.

The second pre pull-down driving unit 202-1 may generate second driving control signals PD<1>_<4:0> in accordance with the second data FDATAS<1>, the second driving strength control signals CONPD<4:0>, and the second impedance control code PDCODE<4:0>.

The third pre pull-down driving unit 202-2 may generate second driving control signals PD<2>_<4:0> in accordance with the second data FDATAS<2>, the second driving strength control signals CONPD<4:0>, and the second impedance control code PDCODE<4:0>.

The fourth pre pull-down driving unit 202-3 may generate second driving control signals PD<3>_<4:0> in accordance with the second data FDATAS<2>, the second driving strength control signals CONPD<4:0>, and the second impedance control code PDCODE<4:0>.

The fifth pre pull-down driving unit 202-4 may generate second driving control signals PD<4>_<4:0> in accordance with the second data FDATAS<2>, the second driving strength control signals CONPD<4:0>, and the second impedance control code PDCODE<4:0>.

Figure 4:
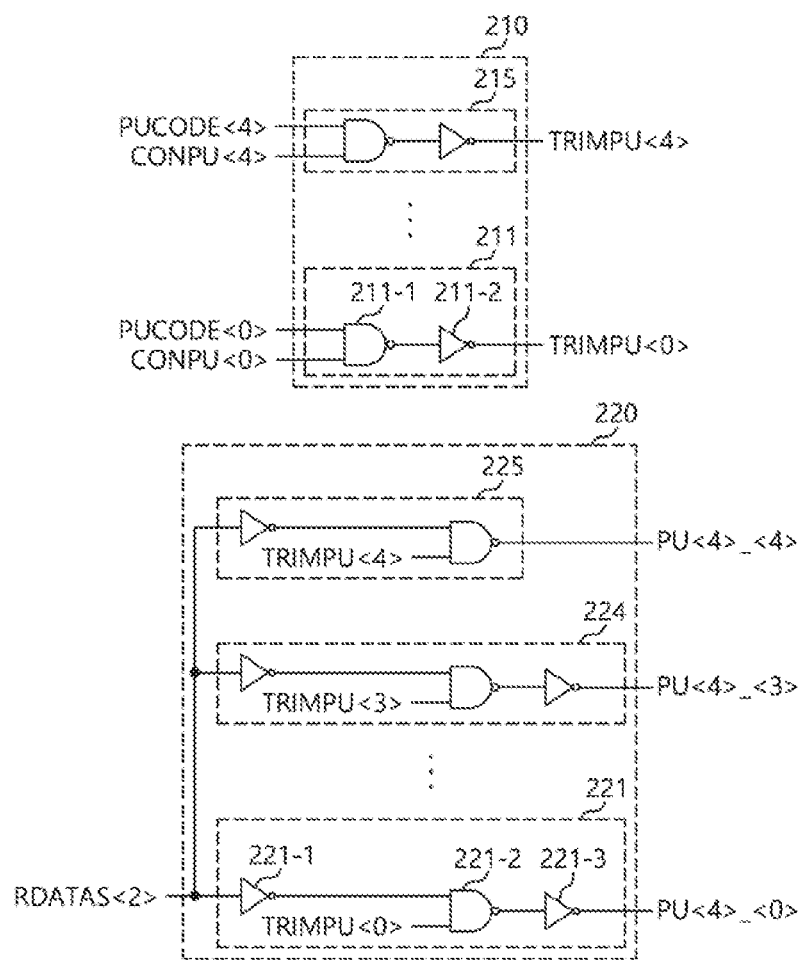
FIG. 4 illustrates a pre pull-up driving unit of FIG. 3.

FIG. 4 is a view illustrating the fifth pre pull-up driving unit 201-4 in FIG. 3.

The pre pull-up driving units 201-0~201-4 may all have substantially the same configuration. Thus, only the configuration of the fifth pre pull-up driving unit 201-4 is illustrated.

Referring to FIG. 4, the fifth pre pull-up driving unit 201-4 may include a code control circuit 210 and a driving control signal generation circuit 220.

The code control circuit 210 may generate a first strength and impedance control signal TRIMPU<4:0> in accordance with the first driving strength control signals CONPU<4:0> and the first impedance control code PUCODE<4:0>.

The code control circuit 210 may bypass the first impedance control code PUCODE<4:0> through the first strength and impedance control signal TRIMPU<4:0> or fix the first strength and impedance control signal TRIMPU<4:0> to a specific logic level in accordance with the first driving strength control signals CONPU<4:0>.

The code control circuit 210 may include a plurality of code control units, i.e., first to fifth code control units 211~215.

The first code control unit 211 may output a signal generated by an AND operation of the first driving strength control signal CONPU<0> and the first impedance control code PUCODE<0> as the first strength and impedance control signal TRIMPU<0>.

The second code control unit 212 may output a signal generated by an AND operation of the first driving strength control signal CONPU<1> and the first impedance control code PUCODE<1> as the first strength and impedance control signal TRIMPU<1> among the first strength and impedance control signals TRIMPU<4:0>.

The third code control unit 213 may output a signal generated by an AND operation of the first driving strength control signal CONPU<2> and the first impedance control code PUCODE<2> as the first strength and impedance control signal TRIMPU<2> among the first strength and impedance control signals TRIMPU<4:0>.

The fourth code control unit 214 may output a signal generated by an AND operation of the first driving strength control signal CONPU<3> and the first impedance control code PUCODE<3> as the first strength and impedance control signal TRIMPU<3> among the first strength and impedance control signals TRIMPU<4:0>.

The fifth code control unit 215 may output a signal generated by an AND operation of the first driving strength control signal CONPU<4> and the first impedance control code PUCODE<4> as the first strength and impedance control signal TRIMPU<4> among the first strength and impedance control signals TRIMPU<4:0>.

In example embodiments, the first to fifth code control units 211~215 may all have substantially the same configuration. Thus, only the configuration of the first code control unit 211 is illustrated.

The first code control unit 211 may include a first logic gate 211-1 and a second logic gate 211-2.

The first logic gate 211-1 may perform a negative AND operation of the first driving strength control signal CONPU<0> among the first driving strength control signals CONPU<4:0> and the first impedance control code PUCODE<0> among the first impedance control codes PUCODE<4:0>.

The second logic gate 211-2 may output a signal generated by inverting an output of the first logic gate 211-1 as the first strength and impedance control signal TRIMPU<0>.

The driving control signal generation circuit 220 may generate the first driving control signals PU<4>_<4:0> in accordance with the first strength and impedance control signal TRIMPU<4:0> and the second data RDATAS<2>.

The driving control signal generation circuit 220 may bypass the second data RDATAS<2> through the first driving control signals PU<4>_<4:0> or fix the first driving control signals PU<4:0>_<4:0> to a specific logic level in accordance with the first strength and impedance control signal TRIMPU<4:0>.

The driving control signal generation circuit 220 may include a plurality of driving control signal generation units, i.e., first to fifth driving control signal generation units 221~225.

The first driving control signal generation unit 221 may output a signal generated by an AND operation of an inverted signal of the second data RDATAS<2> and the first strength and impedance control signal TRIMPU<0> as the first driving control signal PU<4>_<0>.

The second driving control signal generation unit 222 may output a signal generated by an AND operation of the inverted signal of the second data RDATAS<2> and the first strength and impedance control signal TRIMPU<1> as the first driving control signal PU<4>_<1>.

The third driving control signal generation unit 223 may output a signal generated by an AND operation of the inverted signal of the second data RDATAS<2> and the first strength and impedance control signal TRIMPU<2> as the first driving control signal PU<4>_<2>.

The fourth driving control signal generation unit 224 may output a signal generated by an AND operation of the inverted signal of the second data RDATAS<2> and the first strength and impedance control signal TRIMPU<3> as the first driving control signal PU<4>_<3>.

The fifth driving control signal generation unit 225 may output a signal generated by an AND operation of the inverted signal of the second data RDATAS<2> and the first strength and impedance control signal TRIMPU<4> as the first driving control signal PU<4>_<4>.

In example embodiments, the first to fifth driving control signal generation units 221~225 may all have substantially the same configuration. Thus, only the configuration of the first driving control signal generation unit 221 is illustrated.

The first driving control signal generation unit 221 may include a first logic gate 221-1, a second logic gate 221-2, and a third logic gate 221-3.

The first logic gate 221-1 may be configured to invert and output the second data RDATAS<2>.

The second logic gate 221-2 may perform a negative AND operation of an output from the first logic gate 221-1 and the first strength and impedance control signal TRIMPU<0> to output a calculated signal.

The third logic gate 221-3 may be configured to invert an output from the second logic gate 221-2 to output the first driving control signal PU<4>_<0>.

The fifth driving control signal generation unit 225 may have configurations substantially the same as those of the first driving control signal generation unit 221 except for the third logic gate 221-3.

Figure 5:
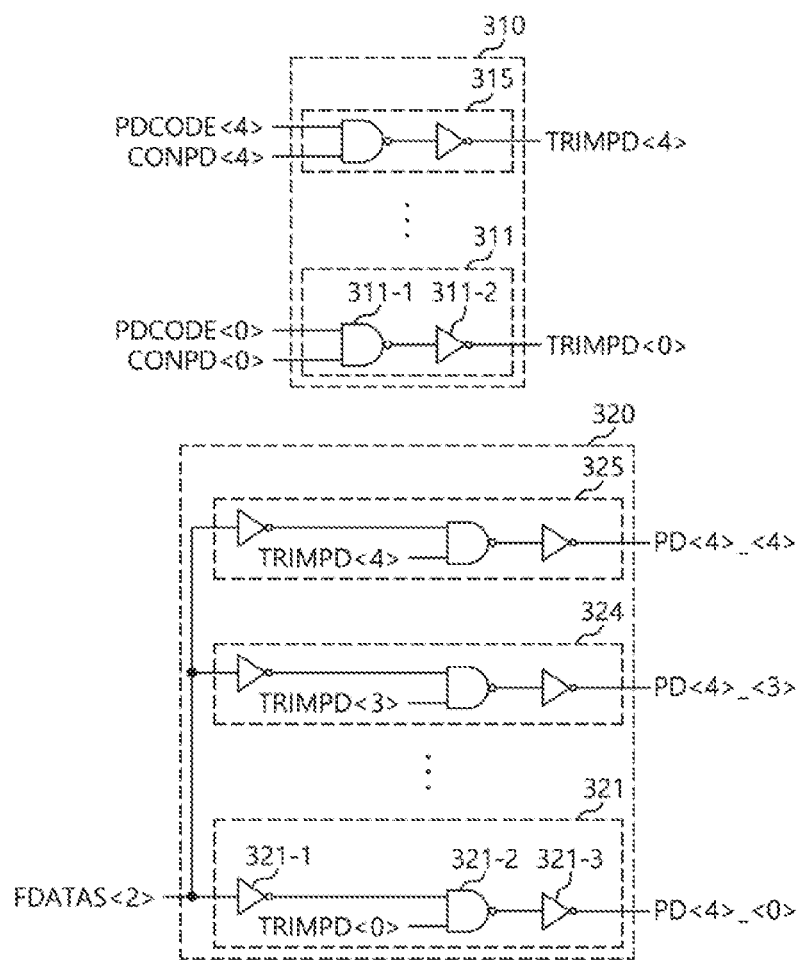
FIG. 5 illustrates a pre pull-down driving unit of FIG. 3.

FIG. 5 is a view illustrating the pre pull-down driving unit 202-4 in FIG. 3.

The pre pull-down driving units 202-0~202-4 may all have substantially the same configuration. Thus, only the configuration of the fifth pre pull-down driving unit 202-4 is illustrated.

Referring to FIG. 5, the fifth pre pull-down driving unit 202-4 may include a code control circuit 310 and a driving control signal generation circuit 320.

The code control circuit 310 may generate a second strength and impedance control signal TRIMPD<4:0> in accordance with the second driving strength control signals CONPD<4:0> and the second impedance control code PDCODE<4:0>.

The code control circuit 310 may bypass the second impedance control code PDCODE<4:0> through the second strength and impedance control signal TRIMPD<4:0> or fix the second strength and impedance control signal TRIMPD<4:0> to a specific logic level in accordance with the second driving strength control signals CONPD<4:0>.

The code control circuit 310 may include a plurality of code control units, i.e., first to fifth code control units 311~315.

The first code control unit 311 may output a signal generated by an AND operation of the second driving strength control signal CONPD<0> among the second driving strength control signals CONPD<4:0> and the second impedance control code PDCODE<0> among the second impedance control codes PDCODE<4:0> as the second strength and impedance control signal TRIMPD<0> among the second strength and impedance control signals TRIMPD<4:0>.

The second code control unit 312 may output a signal generated by an AND operation of the second driving strength control signal CONPD<1> among the second driving strength control signals CONPD<4:0> and the second impedance control code PDCODE<1> among the second impedance control codes PDCODE<4:0> as the second strength and impedance control signal TRIMPD<1> among the second strength and impedance control signals TRIMPD<4:0>.

The third code control unit 313 may output a signal generated by an AND operation of the second driving strength control signal CONPD<2> among the second driving strength control signals CONPD<4:0> and the second impedance control code PDCODE<2> among the second impedance control codes PDCODE<4:0> as the second strength and impedance control signal TRIMPD<2> among the second strength and impedance control signals TRIMPD<4:0>.

The fourth code control unit 314 may output a signal generated by an AND operation of the second driving strength control signal CONPD<3> among the second driving strength control signals CONPD<4:0> and the second impedance control code PDCODE<3> among the second impedance control codes PDCODE<4:0> as the second strength and impedance control signal TRIMPD<3> among the second strength and impedance control signals TRIMPD<4:0>.

The fifth code control unit 315 may output a signal generated by an AND operation of the second driving strength control signal CONPD<4> among the second driving strength control signals CONPD<4:0> and the second impedance control code PDCODE<4> among the second impedance control codes PDCODE<4:0> as the second strength and impedance control signal TRIMPD<4> among the second strength and impedance control signals TRIMPD<4:0>.

In example embodiments, the first to fifth code control units 311~315 may all have substantially the same configuration. Thus, only the configuration of the first code control unit 311 is illustrated.

The first code control unit 311 may include a first logic gate 311-1 and a second logic gate 311-2.

The first logic gate 311-1 may perform a negative AND operation of the second driving strength control signal CONPD<0> among the second driving strength control signals CONPD<4:0> and the second impedance control code PDCODE<0> among the second impedance control codes PDCODE<4:0>.

The second logic gate 311-2 may output a signal generated by inverting an output of the first logic gate 311-1 as the second strength and impedance control signal TRIMPD<0>.

The driving control signal generation circuit 320 may generate the second driving control signals PD<4>_<4:0> in accordance with the second strength and impedance control signal TRIMPD<4:0> and the second data RDATAS<2>.

The driving control signal generation circuit 320 may bypass the second data RDATAS<2> through the second driving control signals PD<4>_<4:0> or fix the second driving control signals PD<4:0>_<4:0> to a specific logic level in accordance with the second strength and impedance control signal TRIMPD<4:0>.

The driving control signal generation circuit 320 may include a plurality of driving control signal generation units, i.e., first to fifth driving control signal generation units 321~325.

The first driving control signal generation unit 321 may output a signal generated by an AND operation of an inverted signal of the second data RDATAS<2> and the second strength and impedance control signal TRIMPD<0> as the second driving control signal PD<4>_<0>.

The second driving control signal generation unit 322 may output a signal generated by an AND operation of the inverted signal of the second data RDATAS<2> and the second strength and impedance control signal TRIMPD<1> as the second driving control signal PD<4>_<1>.

The third driving control signal generation unit 323 may output a signal generated by an AND operation of the inverted signal of the second data RDATAS<2> and the second strength and impedance control signal TRIMPD<2> as the second driving control signal PD<4>_<2>.

The fourth driving control signal generation unit 324 may output a signal generated by an AND operation of the inverted signal of the second data RDATAS<2> and the second strength and impedance control signal TRIMPD<3> as the second driving control signal PD<4>_<3>.

The fifth driving control signal generation unit 325 may output a signal generated by an AND operation of the inverted signal of the second data RDATAS<2> and the second strength and impedance control signal TRIMPD<4> as the second driving control signal PD<4>_<4>.

In example embodiments, the first to fifth driving control signal generation units 321~325 may all have substantially the same configuration. Thus, only the configuration of the first driving control signal generation unit 321 is illustrated.

The first driving control signal generation unit 321 may include a first logic gate 321-1, a second logic gate 321-2, and a third logic gate 321-3.

The first logic gate 321-1 may be configured to invert and output the second data RDATAS<2>.

The second logic gate 321-2 may perform a negative AND operation of an output from the first logic gate 321-1 and the second strength and impedance control signal TRIMPD<0> to output a calculated signal.

The third logic gate 321-3 may be configured to invert an output from the second logic gate 321-2 to output the second driving control signal PD<4>_<0>.

Figure 6:
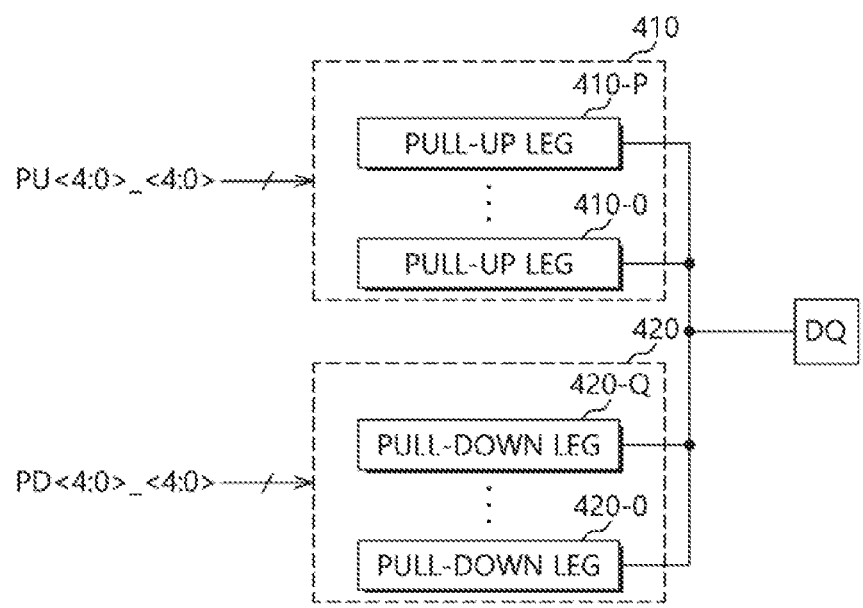
FIG. 6 illustrates a main driver of FIG. 1.

FIG. 6 is a view illustrating the main driver 103 in FIG. 1.

Referring to FIG. 6, the main driver 103 may include a first driver 410 and a second driver 420 connected to the output terminal DQ in common.

The first driver 410 may pull-up the output terminal DQ to meet a termination impedance and a driving strength determined in accordance with the first driving control signals PU<4>_<4:0>.

The second driver 420 may pull-down the output terminal DQ to meet a termination impedance and a driving strength determined in accordance with the second driving control signals PD<4>_<4:0>.

The first driver 410 may include a plurality of pull-up legs 410-0~410-P.

The pull-up legs 410-0~410-P may be designed for combinations of impedance values for embodying the driving strength and the termination impedance determined a specification of a semiconductor device.

Numbers of the pull-up legs 410-0~410-P and a target impedance of each of the pull-up legs 410-0~410-P may be determined in accordance with the specification of the semiconductor device.

A distribution manner for distributing the first driving control signals PU<4>_<4:0> to the pull-up legs 410-0~410-P may be determined in accordance with the specification of the semiconductor device.

Each of signal components of the first driving control signals PU<4:0>_<4:0> may be inputted into a part of the pull-up legs 410-0~410-P in one-to-one relation. At least one of the signal components of the first driving control signals PU<4:0>_<4:0> may be inputted into another part of the pull-up legs 410-0~410-P in common.

The second driver 420 may include a plurality of pull-down legs 420-0~420-Q.

The pull-down legs 420-0~420-Q may be designed for combinations of impedance values for embodying the driving strength and the termination impedance determined a specification of a semiconductor device.

Numbers of the pull-down legs 420-0~420-Q and a target impedance of each of the pull-down legs 420-0~420-Q may be determined in accordance with the specification of the semiconductor device.

A distribution manner for distributing the second driving control signals PD<4>_<4:0> to the pull-down legs 420-0~420-Q may be determined in accordance with the specification of the semiconductor device.

Each of signal components of the second driving control signals PD<4:0>_<4:0> may be inputted into a part of the pull-down legs 420-0~420-Q in one-to-one relation. At least one of the signal components of the second driving control signals PD<4:0>_<4:0> may be inputted into another part of the pull-down legs 420-0~420-Q in common.

Figure 7:
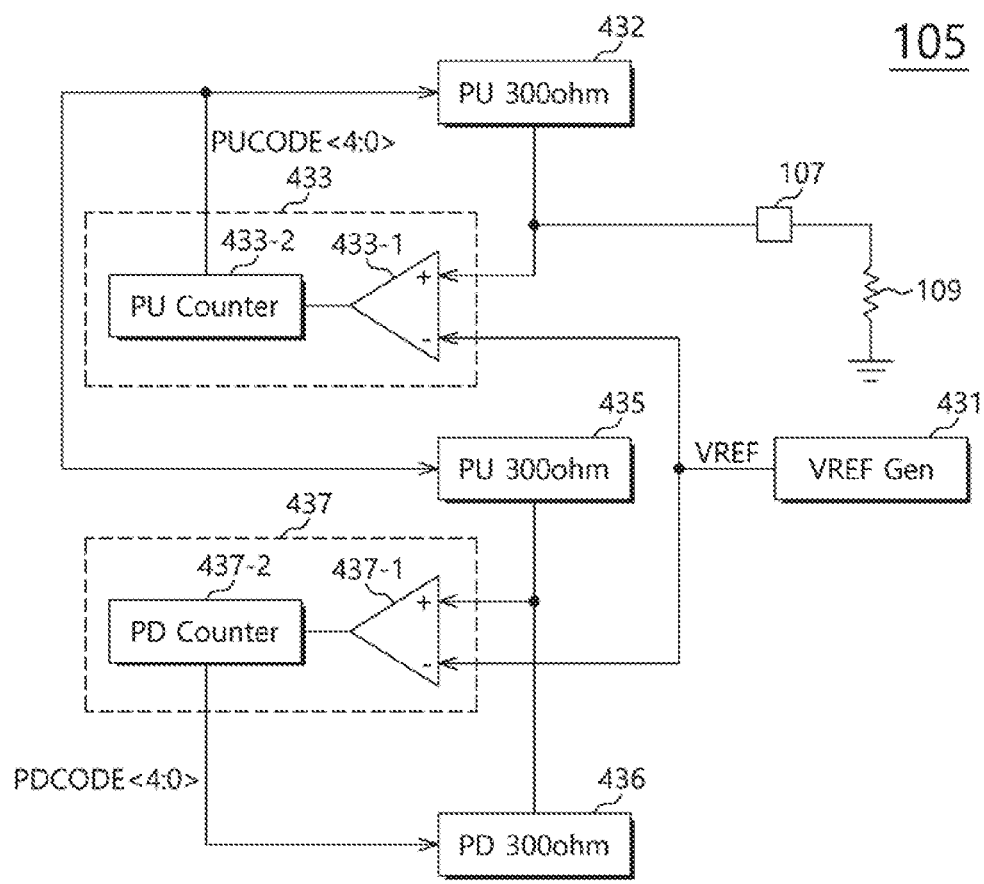
FIG. 7 illustrates an impedance calibration circuit of FIG. 1.

FIG. 7 is a view illustrating the impedance calibration circuit 105 in FIG. 1.

In FIG. 7, when a resistance of the external resistor 109 may be about 300 ohm, the impedance calibration circuit 105 may be designed for embodying the driving strength and the termination impedances determined in accordance with the specification of the semiconductor device.

Referring to FIG. 7, the impedance calibration circuit 105 may include a reference voltage generation circuit (VREF Gen) 431, a first reproduction leg 432, a first code generation circuit 433, a second reproduction leg 435, a third reproduction leg 436, and a second code generation circuit 437.

The reference voltage generation circuit 431 may be configured to generate a reference voltage VREF. For example, the reference voltage VREF may be a half of the power voltage.

The first reproduction leg 432 may have impedance controlled in accordance with the first impedance control code PUCODE<4:0>.

The first reproduction leg 432 may be designed for having a first target value, i.e., impedance substantially the same as the resistance of the external resistor 109 of about 300 ohm.

For example, the first reproduction leg 432 may be formed by reproducing any one of the pull-up legs 410-0~410-P.

The first reproduction leg 432 may be connected with the external resistor 109 through the external resistor pad 107.

The first code generation circuit 433 may be configured to control a value of the first impedance control code PUCODE<4:0> in accordance with comparison results between a voltage of a node, which may be connected to the first reproduction leg 432 and the external resistor 109, and the reference voltage VREF.

The first code generation circuit 433 may include a first comparator 433-1 and a first counter 433-2.

The first comparator 433-1 may compare the voltage of the node connected to the first reproduction leg 432 and the external resistor 109 with the reference voltage VREF. The first comparator 433-1 may then output the comparison results.

The first counter 433-2 may control the value of the first impedance control code PUCODE<4:0> in accordance with the outputs from the first comparator 433-1.

The second reproduction leg 435 may have impedance controlled in accordance with the first impedance control code PUCODE<4:0>.

The second reproduction leg 435 may be designed for having the first target value, i.e., impedance substantially the same as the resistance of the external resistor 109 of about 300 ohm.

The second reproduction leg 435 may have configurations substantially the same as those of the first reproduction leg 432.

The third reproduction leg 436 may have impedance controlled in accordance with the second impedance control code PDCODE<4:0>. For example, the third reproduction leg 436 may be formed by reproducing any one of the pull-down legs 420-0~420-Q.

The second code generation circuit 437 may be configured to control a value of the second impedance control code PDCODE<4:0> in accordance with comparison results between a voltage of a node, which may be connected to the second reproduction leg 435 and the third reproduction leg 436, and the reference voltage VREF.

The second code generation circuit 437 may include a second comparator 437-1 and a second counter 437-2.

The second comparator 437-1 may compare the voltage of the node connected to the second reproduction leg 435 and the third reproduction leg 436 with the reference voltage VREF. The second comparator 437-1 may then output the comparison results.

The second counter 437-2 may control the value of the second impedance control code PDCODE<4:0> in accordance with the outputs from the second comparator 437-1.

Hereinafter, operations of the impedance calibration circuit 105 may be illustrated in detail.

Because the external resistor 109 may be arranged outside a semiconductor chip, the external resistor 109 may have a constant resistance, i.e., about 300 ohm regardless of internal operation environments.

Therefore, an operation for controlling the impedance of the first reproduction leg 432 to the resistance of the external resistor 109 as the target value may be performed.

The voltage of the node connected to the first reproduction leg 432 and the external resistor 109 may be compared with the reference voltage VREF. When the voltage of the node may be coincided with the reference voltage VREF within an error range, the controlling of the first impedance control code PUCODE<4:0> may be completed.

Because the first impedance control code PUCODE<4:0> may be provided to the second reproduction leg 435, controlling for the impedance of the second reproduction leg 435 may be completed simultaneously with completing the control of the first reproduction leg 432.

An operation for controlling the impedance of the third reproduction leg 436 to the impedance of the second reproduction leg 435 as the target value may then be performed.

The voltage of the node connected to the second reproduction leg 435 and the third reproduction leg 436 may be compared with the reference voltage VREF. When the voltage of the node may be coincided with the reference voltage VREF within an error range, the controlling of the second impedance control code PDCODE<4:0> may be completed.

Figure 8:
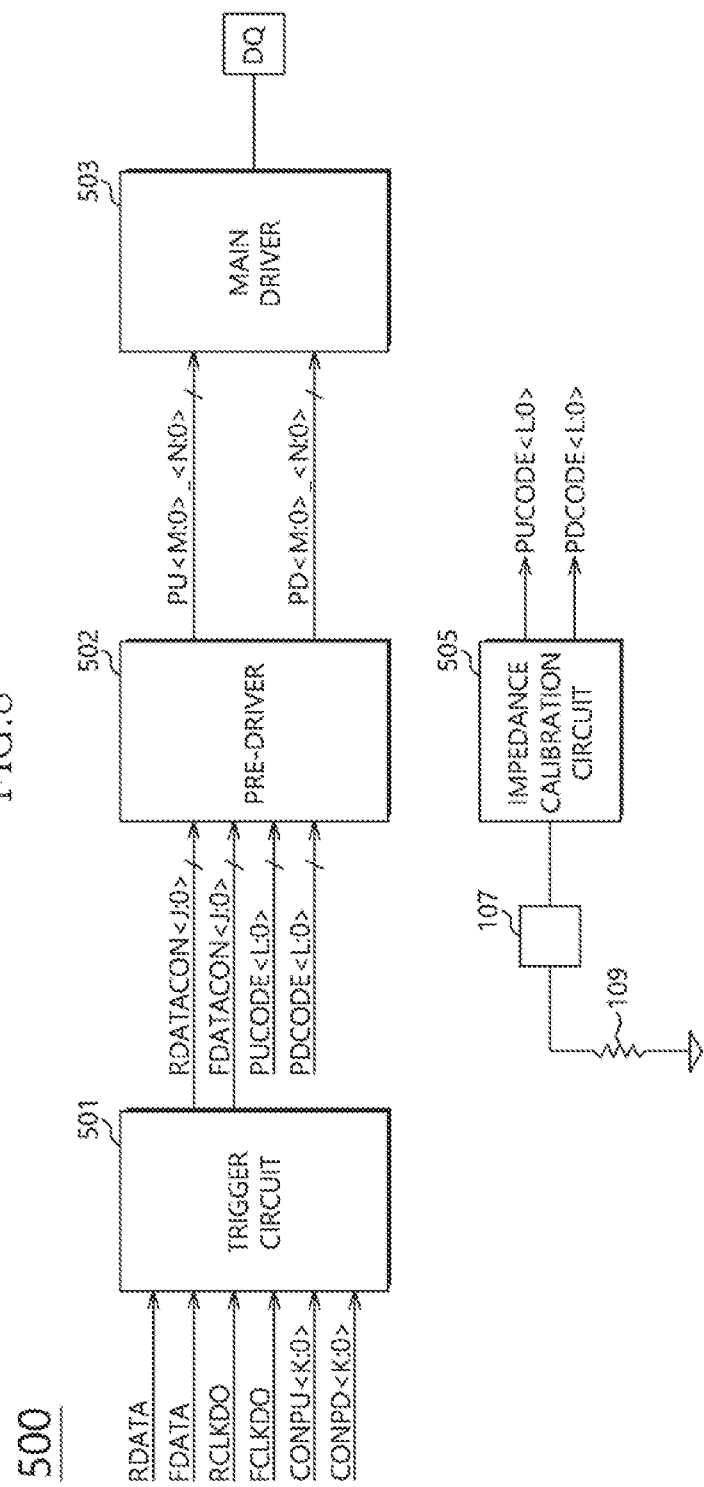
FIG. 8 illustrates a data driving circuit in accordance with an embodiment.

FIG. 8 is a view illustrating a data driving circuit 500 in accordance with example embodiments.

Referring to FIG. 8, the data driving circuit 500 may include a trigger circuit 501, a pre-driver 502, and a main driver 503.

Further, the data driving circuit 500 of this example embodiment may further include an impedance calibration circuit 505.

The trigger circuit 501 may be configured to block remaining signal paths among a plurality of signal paths for transmitting data except for a signal path corresponding to a currently selected driving strength.

The trigger circuit 501 may block remaining signal paths among a plurality of signal paths for transmitting second data RDATACON<J:0> and FDATACON<J:0> except for a signal path corresponding to a currently selected driving strength. The second data RDATACON<J:0> and FDATACON<J:0> may be generated by latching a plurality of first data RDATA and FDATA in accordance with a plurality of clock signals RCLKDO and FCLKDO having phase difference.

The trigger circuit 501 may determine a driving strength and a signal path corresponding to the driving strength in accordance with a plurality of driving strength control signals CONPU<K:0> and CONPD<K:0>.

The pre-driver 102 may drive data, which may be transmitted through a signal path selected by the trigger circuit 510 among the second data RDATACON<J:0> and FDATACON<J:0>, using impedance determined in accordance with a plurality of impedance control codes PUCODE<L:0> and PDCODE<L:0> to output a plurality of driving control signals PU<M:0>_<N:0> and PD<M:0>_<N:0>.

The main driver 103 may drive an output terminal DQ in accordance with the driving control signals PU<M:0>_<N:0> and PD<M:0>_<N:0>.

The impedance calibration circuit 103 may control the impedance control codes PUCODE<L:0> and PDCODE<L:0> to have a resistance of an external resistor 109 connected to an external resistor pad 107 as a target value.

Figure 9:
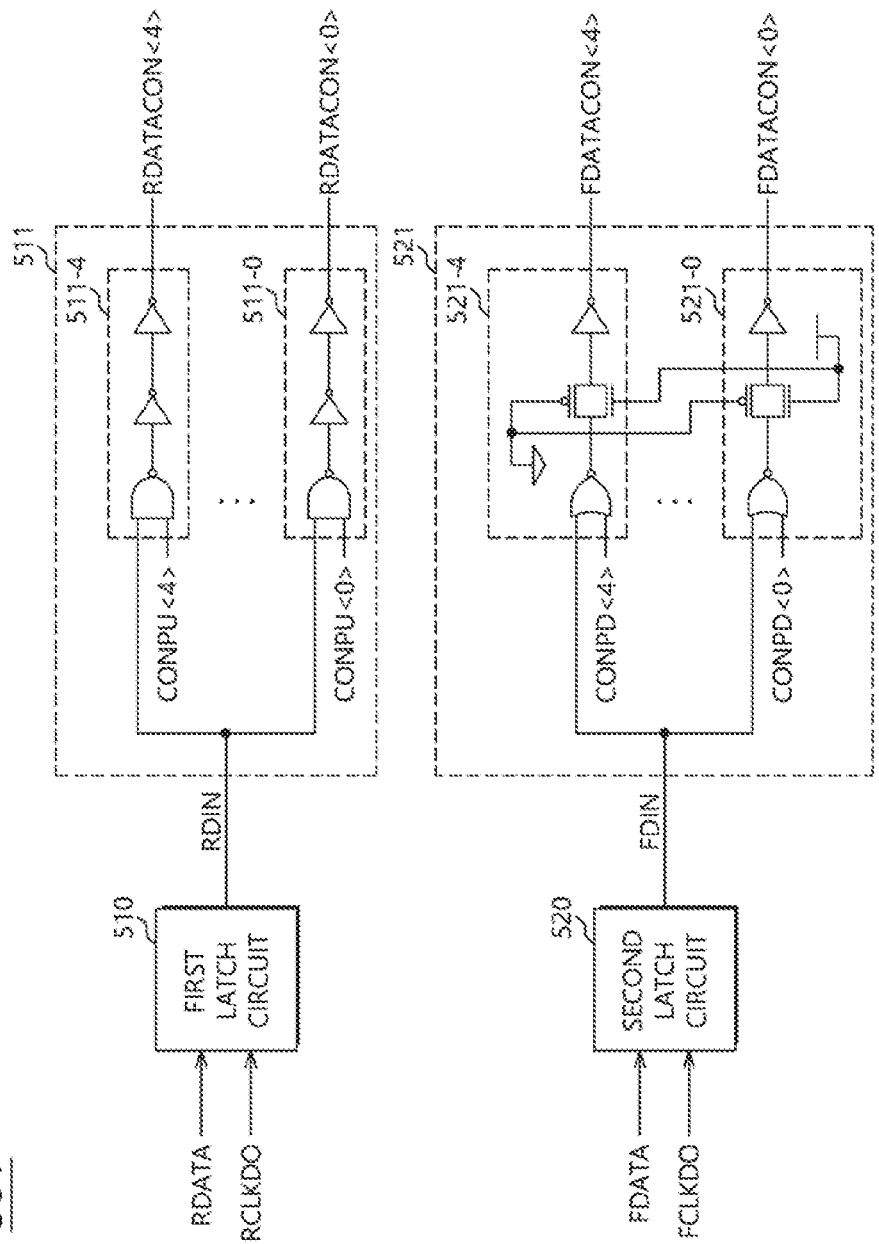
FIG. 9 illustrates a trigger circuit of FIG. 8.

FIG. 9 is a view illustrating the trigger circuit 501 in FIG. 8.

FIG. 9 shows the trigger circuit 501 when J in the second data RDATACON<J:0> and FDATACON<J:0> is 2 and when K, L, M, and N in the driving strength control signals CONPU<K:0> and CONPD<K:0>, the impedance control codes PUCODE<L:0> and PDCODE<L:0>, and the driving control signals PU<M:0>_<N:0> are 4.

Referring to FIG. 9, the trigger circuit 501 may include a first latch circuit 510, a first signal distribution circuit 511, a second latch circuit 520, and a second signal distribution circuit 521.

The first latch circuit 510 may latch first data RDATA in accordance with a first clock signal RCLKDO among the clock signals RCLKDO and FCLKDO to generate a first latch signal RDIN.

In example embodiments, the first signal distribution circuit 511 may include a plurality of first signal paths 511-0~511-4.

The first signal distribution circuit 511 may distribute the first latch signal RDIN through only a signal path among the first signal paths 511-0~511-4 selected in accordance with the first driving strength control signals CONPU<4:0> to output second data RDATACON<2:0> among the second data RDATACON<2:0> and FDATACON<2:0>.

The first signal paths 511-0~511-4 may all have substantially the same configuration. Thus, any one 511-0 of the first signal paths 511-0~511-4 may be illustrated herein.

When the first driving strength control signal CONPU<0> is only a high level, the signal path 511-0 may invert and output the first latch signal RDIN.

When the first driving strength control signal CONPU<0> may be a low level, the signal path 511-0 may fix the second data RDATACON<0> to a high level regardless of a logic level of the first latch signal RDIN.

The signal path 511-0 may include a NAND gate and an inverter chain.

The NAND gate may perform a negative AND operation of the first driving strength control signal CONPU<0> and the first latch signal RDIN.

The second latch circuit 520 may latch first data FDATA in accordance with a second clock signal FCLKDO among the clock signals RCLKDO and FCLKDO to generate a second latch signal FDIN.

The second signal distribution circuit 521 may include a plurality of second signal paths 521-0~521-4.

The second signal distribution circuit 521 may distribute the second latch signal FDIN through only a signal path among the second signal paths 521-0~521-4 selected in accordance with the second driving strength control signals CONPD<4:0> to output second data FDATACON<2:0> among the second data RDATACON<2:0> and FDATACON<2:0>.

The second signal paths 521-0~521-4 may all have substantially the same configuration. Thus, any one 521-0 of the second signal paths 521-0~521-4 may be illustrated herein.

When the second driving strength control signal CONPD<0> may be a low level, the signal path 521-0 may invert and output the second latch signal FDIN.

When the second driving strength control signal CONPD<0> may be a high level, the signal path 521-0 may fix the second data FDATACON<0> to a high level regardless of a logic level of the second latch signal FDIN.

The signal path 521-0 may include a NOR gate, a transmission gate and an inverter.

The NAND gate may perform a negative AND operation of the first driving strength control signal CONPU<0> and the first latch signal RDIN.

The NOR gate may perform a negative OR operation of the second driving strength control signal CONPD<0> and the second latch signal FDIN.

The transmission gate may include a negative control terminal configured to receive a ground voltage and a positive control terminal configured to receive a power voltage.

The transmission gate may configured to provide the signal path 521-0 with a signal delay time substantially the same as that of the signal path 511-0 of the first signal distribution circuit 511.

The inverter may invert an output of the NOR gate to output the second data FDATACON<0>.

Figure 10:
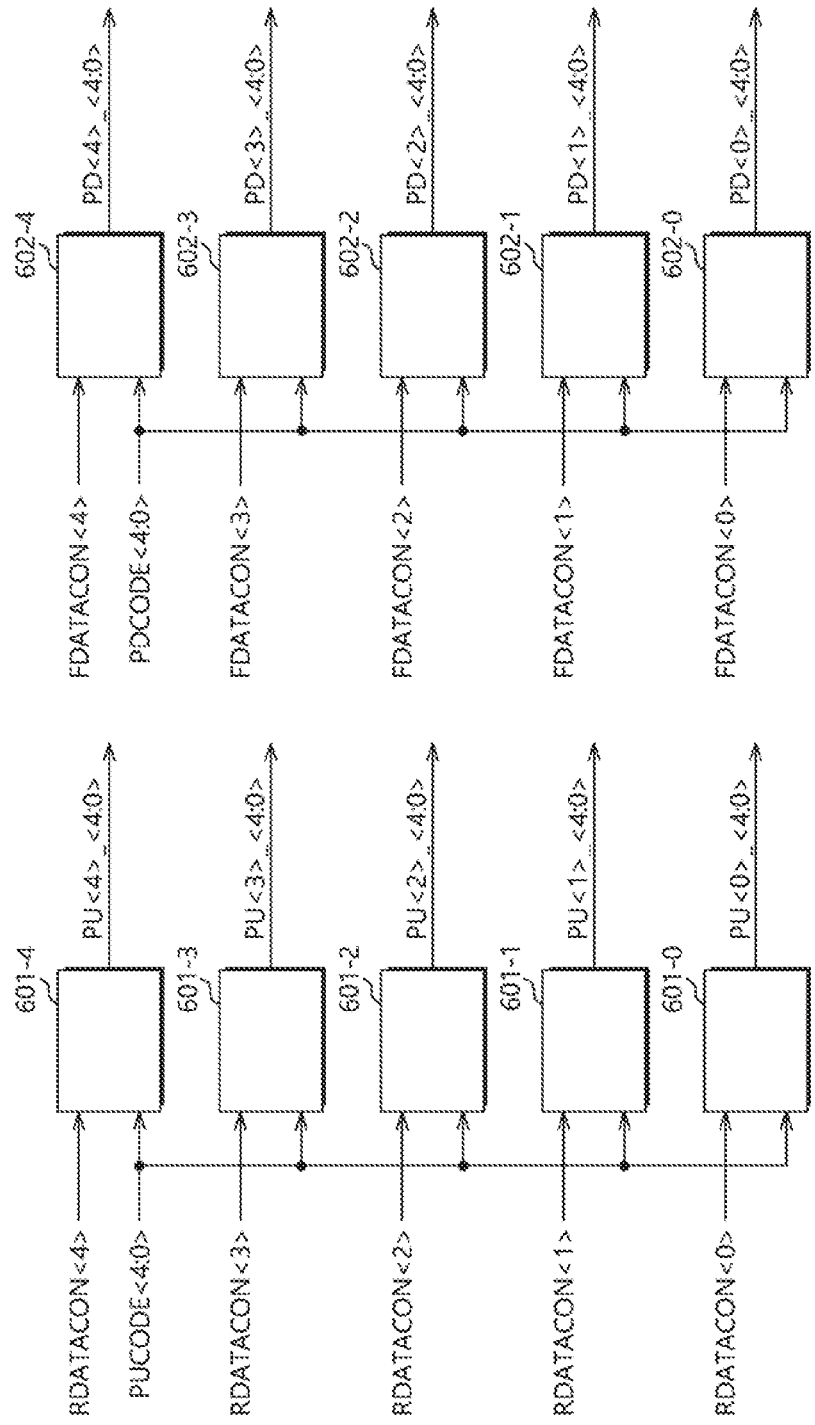
FIG. 10 illustrates a pre-driver of FIG. 8.

FIG. 10 is a view illustrating the pre-driver 502 in FIG. 8.

Referring to FIG. 10, the pre-driver 502 may include a plurality of pre driving units 601-0~601-4 and 602-0~602-4.

The pre driving units 601-0~601-4 and 602-0~602-4 may be classified into a plurality of pre pull-up driving units 601-0~602-4 and a plurality of pre pull-down driving units 602-0~602-4.

The first pre pull-up driving unit 601-0 may generate first driving control signals PU<0>_<4:0> in accordance with the second data RDATACON<0> and the first impedance control code PUCODE<4:0>.

The second pre pull-up driving unit 601-1 may generate first driving control signals PU<1>_<4:0> in accordance with the second data RDATACON<1> and the first impedance control code PUCODE<4:0>.

The third pre pull-up driving unit 601-2 may generate first driving control signals PU<2>_<4:0> in accordance with the second data RDATACON<2> and the first impedance control code PUCODE<4:0>.

The fourth pre pull-up driving unit 601-3 may generate first driving control signals PU<3>_<4:0> in accordance with the second data RDATACON<2> and the first impedance control code PUCODE<4:0>.

The fifth pre pull-up driving unit 601-4 may generate first driving control signals PU<4>_<4:0> in accordance with the second data RDATACON<2> and the first impedance control code PUCODE<4:0>.

The first pre pull-down driving unit 602-0 may generate second driving control signals PD<0>_<4:0> in accordance with the second data FDATACON<0> and the second impedance control code PDCODE<4:0>.

The second pre pull-down driving unit 602-1 may generate second driving control signals PD<1>_<4:0> in accordance with the second data FDATACON<1> and the second impedance control code PDCODE<4:0>.

The third pre pull-down driving unit 602-2 may generate second driving control signals PD<2>_<4:0> in accordance with the second data FDATACON<2> and the second impedance control code PDCODE<4:0>.

The fourth pre pull-down driving unit 602-3 may generate second driving control signals PD<3>_<4:0> in accordance with the second data FDATACON<2> and the second impedance control code PDCODE<4:0>.

The fifth pre pull-down driving unit 602-4 may generate second driving control signals PD<4>_<4:0> in accordance with the second data FDATACON<2> and the second impedance control code PDCODE<4:0>.

Figure 11:
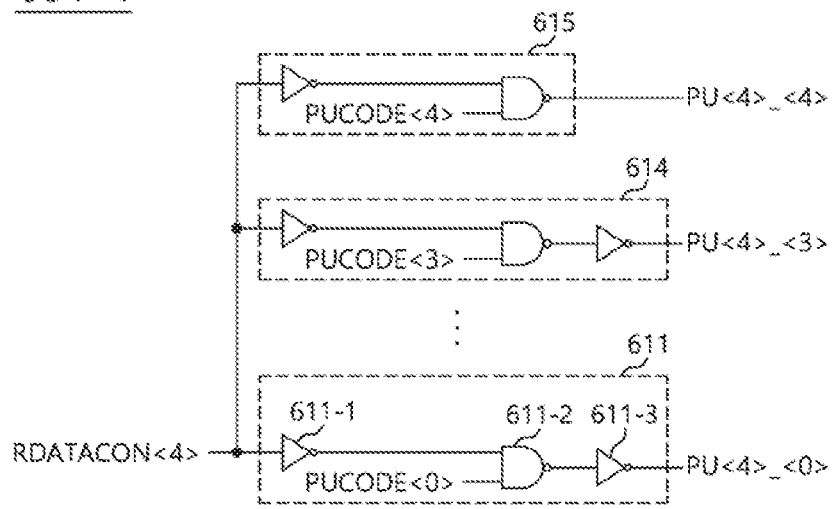
FIG. 11 illustrates a pre pull-up driving unit of FIG. 10.

FIG. 11 is a view illustrating the fifth pre pull-up driving unit 601-4 in FIG. 10.

The pre pull-up driving units 601-0~601-4 may all have substantially the same configuration. Thus, only the configuration of the fifth pre pull-up driving unit 601-4 is illustrated.

Referring to FIG. 11, the fifth pre pull-up driving unit 601-4 may include a plurality of code control units, i.e., first to fifth code control units 611~615.

The first code control unit 611 may output a signal generated by an AND operation of an inverted signal of the second data RDATACON<4> and the first impedance control code PUCODE<0> among the first impedance control codes PUCODE<4:0> as the first driving control signal PU<4>_<0> among the first driving control signals PU<4>_<4:0>.

The second code control unit 612 may output a signal generated by an AND operation of an inverted signal of the second data RDATACON<4> and the first impedance control code PUCODE<1> among the first impedance control codes PUCODE<4:0> as the first driving control signal PU<4>_<1> among the first driving control signals PU<4>_<4:0>.

The third code control unit 613 may output a signal generated by an AND operation of an inverted signal of the second data RDATACON<4> and the first impedance control code PUCODE<2> among the first impedance control codes PUCODE<4:0> as the first driving control signal PU<4>_<2> among the first driving control signals PU<4>_<4:0>.

The fourth code control unit 614 may output a signal generated by an AND operation of an inverted signal of the second data RDATACON<4> and the first impedance control code PUCODE<3> among the first impedance control codes PUCODE<4:0> as the first driving control signal PU<4>_<3> among the first driving control signals PU<4>_<4:0>.

The fifth code control unit 615 may output a signal generated by an AND operation of an inverted signal of the second data RDATACON<4> and the first impedance control code PUCODE<4> among the first impedance control codes PUCODE<4:0> as the first driving control signal PU<4>_<4> among the first driving control signals PU<4>_<4:0>.

In example embodiments, the first to fifth code control units 611~615 may all have substantially the same configuration. Thus, only the configuration of the first code control unit 611 is illustrated.

The first code control unit 611 may include a first logic gate 611-1, a second logic gate 611-2 and a third logic gate 611-3.

The first logic gate 611-1 may be configured to invert and output the second data RDATACON<4>.

The second logic gate 611-2 may perform a negative AND operation of an output from the first logic gate 611-1 and the first impedance control code PUCODE<0> to output a calculated signal.

The third logic gate 611-3 may be configured to invert an output from the second logic gate 611-2 to output the first driving control signal PU<4>_<0>.

The fifth code control unit 615 may have configurations substantially the same as those of the first code control unit 611 except for the third logic gate 611-3.

Figure 12:
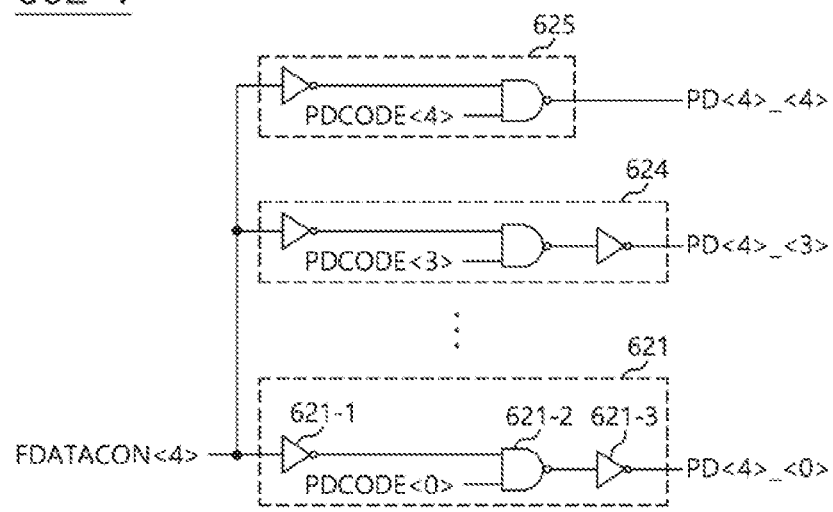
FIG. 12 illustrates a pre pull-down driving unit of FIG. 10.

FIG. 12 is a view illustrating the fifth pre pull-down driving unit 602-4 in FIG. 10.

The pre pull-down driving units 602-0~602-4 may all have substantially the same configuration. Thus, only the configuration of the fifth pre pull-down driving unit 602-4 is illustrated.

Referring to FIG. 12, the fifth pre pull-down driving unit 602-4 may include a plurality of code control units, i.e., first to fifth code control units 621~625.

The first code control unit 621 may output a signal generated by an AND operation of an inverted signal of the second data FDATACON<4> and the second impedance control code PDCODE<0> among the second impedance control codes PDCODE<4:0> as the second driving control signal PD<4>_<0> among the second driving control signals PD<4>_<4:0>.

The second code control unit 622 may output a signal generated by an AND operation of an inverted signal of the second data FDATACON<4> and the second impedance control code PDCODE<1> among the second impedance control codes PDCODE<4:0> as the second driving control signal PD<4>_<1> among the second driving control signals PD<4>_<4:0>.

The third code control unit 623 may output a signal generated by an AND operation of an inverted signal of the second data FDATACON<4> and the second impedance control code PDCODE<2> among the second impedance control codes PDCODE<4:0> as the second driving control signal PD<4>_<2> among the second driving control signals PD<4>_<4:0>.

The fourth code control unit 624 may output a signal generated by an AND operation of an inverted signal of the second data FDATACON<4> and the second impedance control code PDCODE<3> among the second impedance control codes PDCODE<4:0> as the second driving control signal PD<4>_<3> among the second driving control signals PD<4>_<4:0>.

The fifth code control unit 625 may output a signal generated by an AND operation of an inverted signal of the second data FDATACON<4> and the second impedance control code PDCODE<4> among the second impedance control codes PDCODE<4:0> as the second driving control signal PD<4>_<4> among the second driving control signals PD<4>_<4:0>.

In example embodiments, the first to fifth code control units 621~625 may all have substantially the same configuration. Thus, only the configuration of the first code control unit 621 is illustrated.

The first code control unit 621 may include a first logic gate 621-1, a second logic gate 621-2 and a third logic gate 621-3.

The first logic gate 621-1 may be configured to invert and output the second data RDATACON<4>.

The second logic gate 621-2 may perform a negative AND operation of an output from the first logic gate 621-1 and the second impedance control code PDCODE<0> to output a NAND operated signal.

The third logic gate 621-3 may be configured to invert an output from the second logic gate 621-2 to output the second driving control signal PD<4>_<0>.

In example embodiments, the main driver 503 may have a structure substantially the same as that in FIG. 6. Thus, any further illustrations with respect to the main driver 503 may be omitted herein for brevity.

Further, the impedance calibration circuit 505 may have a structure substantially the same as that in FIG. 7. Thus, any further illustrations with respect to the impedance calibration circuit 505 may be omitted herein for brevity.

Hereinafter, operations of the data driving circuit 500 may be illustrated in detail.

The trigger circuit 501 may transmit the second data RDATAS<J:0> and FDATAS<J:0>, which may be generated by latching the data RDATA and FDATA in accordance with the clock signals RCLK and FCLK, through a selected signal path, not all of the first and second signal paths 511-0~511-4 and 521-0~521-4 illustrated with reference to FIG. 9.

The trigger circuit 501 may select at least one of the signal paths 511-0~511-4 and 521-0~521-4 in accordance with the driving strength control signals CONPU<4:0> and CONPD<4:0>.

A non-selected signal path among the first and second signal paths 511-0~511-4 and 521-0~521-4 may be fixed to a specific logic level to cut a current consumption.

The pre-driver 502 may apply the impedance control codes PUCODE<4:0> and PDCODE<4:0> to a part of the second data RDATAS<J:0> and FDATA<J:0> transmitted through the selected signal path to generate the driving control signals PU<4:0>_<4:0> and PD<4:0>_<4:0>.

The main driver 503 may drive the output terminal DQ to meet the termination impedance and the driving strength determined in accordance with the driving control signals PU<4:0>_<4:0> and PD<4:0>_<4:0>.

The above described embodiments of the present teachings are intended to illustrate and not to limit the present teachings. Various alternatives and equivalents are possible. The present teachings not limited by the embodiments described herein. Nor are the present teachings limited to any specific type of semiconductor device. Additions, subtractions, or modifications are possible in view of the present disclosure and are intended to fall within the scope of the appended claims.

What is claimed is:

1. A data driving circuit comprising:
   a trigger circuit configured to block remaining signal paths among a plurality of signal paths for transmitting data except for a signal path corresponding to a currently selected driving strength; and
   a pre-driver configured to drive data, which are transmitted through the signal path corresponding to the currently selected driving strength, using an impedance determined in accordance with a plurality of impedance control codes,
   wherein the trigger circuit is configured to block remaining signal paths among a plurality of signal paths for transmitting a plurality of second data, which are generated by latching a plurality of first data in accordance with a plurality of clock signals having a phase difference, corresponding to the currently selected driving strength.

2. The data driving circuit of claim 1, wherein the trigger circuit comprises:
   a first latch circuit configured to latch any one of first data in accordance with a first clock signal to generate a first latch signal;
   a first signal distribution circuit configured to distribute the first latch signal through only a signal path among a plurality of first signal paths in the signal paths selected in accordance with first driving strength control signals to output the distributed first latch signal as a part of a plurality of second data;
   a second latch circuit configured to latch the other one of the first data in accordance with a second clock signal to generate a second latch signal; and
   a second signal distribution circuit configured to distribute the second latch signal through only a signal path among a plurality of second signal paths in the signal paths selected in accordance with second driving strength control signals to output the distributed second latch signal as a part of a plurality of the second data.

3. The data driving circuit of claim 1, wherein the pre-driver comprises:
   a plurality of pre pull-up driving units configured to drive data, which are transmitted through the signal path corresponding to the currently selected driving strength, in accordance with a first impedance control code among the impedance control codes; and
   a plurality of pre pull-down driving units configured to drive data, which are transmitted through the signal path corresponding to the currently selected driving strength, in accordance with a second impedance control code among the impedance control codes.

4. The data driving circuit of claim 1, further comprising a main driver configured to drive an output terminal in accordance with outputs from the trigger circuit.

5. The data driving circuit of claim 4, wherein the main driver comprises:
   a first driver configured to pull-up the output terminal in accordance with first driving control signals among the outputs from the trigger circuit; and
   a second driver configured to pull-down the output terminal in accordance with second driving control signals among the outputs from the trigger circuit.

6. The data driving circuit of claim 4, wherein the main driver comprises a plurality of pull-up legs and a plurality of pull-down legs commonly connected to the output terminal.

7. The data driving circuit of claim 6, wherein each of signal components of first driving control signals is inputted into a part of the pull-up legs in one-to-one relation, and at least one of the first driving control signals is commonly inputted into the other part of the pull-up legs.

8. The data driving circuit of claim 6, wherein each of signal components of second driving control signals is inputted into a part of the pull-down legs in one-to-one relation, and at least one of the second driving control signals is inputted into the other part of the pull-down legs in common.

9. The data driving circuit of claim 1, further comprising an impedance calibration circuit configured to control the impedance control codes using a resistance of an external resistor as a target value.

10. The data driving circuit of claim 9, wherein the impedance calibration circuit comprises:
    a first reproduction leg connected to the external resistor, the first reproduction leg having an impedance controlled in accordance with a first impedance control code;
    a first code generation circuit configured to control a value of the first impedance control code in accordance with comparison results between a voltage of a first node, which is connected to the first reproduction leg and the external resistor, and a reference voltage;
    a second reproduction leg having an impedance controlled in accordance with the first impedance control code;
    a third reproduction leg having an impedance controlled in accordance with a second impedance control code; and a second code generation circuit configured to control a value of the second impedance control code in accordance with comparison results between a voltage of a second node, which is connected to the second reproduction leg and the third reproduction leg, and the reference voltage.

11. The data driving circuit of claim 10, wherein the first code generation circuit comprises:
   a comparator configured to compare the voltage of the first node with the reference voltage to output the comparison results; and
   a counter configured to control the value of the first impedance control code in accordance with outputs from the comparator.

12. The data driving circuit of claim 10, wherein the second code generation circuit comprises:
   a comparator configured to compare the voltage of the second node with the reference voltage to output the comparison results; and
   a counter configured to control the value of the second impedance control code in accordance with outputs from the comparator.

* * * * *